(12) United States Patent
Radulov et al.

(10) Patent No.: US 7,076,384 B1
(45) Date of Patent: Jul. 11, 2006

(54) METHOD AND APPARATUS FOR CALIBRATING A CURRENT-BASED CIRCUIT

(75) Inventors: Georgi I Radulov, Eindhoven (NL); Patrick J. Quinn, Chapelizod (IE); Johannes A. Hegt, Rosmalen (NL); Arthur H. M. van Roermund, Helmond (NL)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/955,808

(22) Filed: Sep. 29, 2004

(51) Int. Cl.
*G01R 35/00* (2006.01)

(52) U.S. Cl. .................. 702/85; 702/64; 702/107; 324/601; 341/126; 341/120; 341/118; 341/145

(58) Field of Classification Search .............. 702/85, 702/64, 107; 324/601; 341/145, 118, 120, 341/144, 126
See application file for complete search history.

(56) References Cited

U.S. PATENT DOCUMENTS

| | | | |
|---|---|---|---|
| 5,446,455 A | * | 8/1995 | Brooks .................. 341/145 |
| 5,646,619 A | * | 7/1997 | Daubert et al. ......... 341/118 |
| 5,666,118 A | * | 9/1997 | Gersbach ................ 341/120 |
| 5,955,980 A | * | 9/1999 | Hanna ................... 341/120 |
| 6,507,296 B1 | | 1/2003 | Lee et al. |
| 6,956,512 B1 | | 10/2005 | San et al. |

OTHER PUBLICATIONS

Radulov, G. I. et al.; "A Calibration Algorithm for Current-Steering DACs with Relaxed Design Requirments," available from Xilinx, Inc., 2100 Logic Drive, San Jose, CA 95124.

Radulov, G. I. et al.; "A Self-Calibrating Current-Steering 12-Bit DAC Based On New 1-Bit Self-Test Scheme", available from Xilinx, Inc., 2100 Logic Drive, San Jose, CA 95124.

\* cited by examiner

*Primary Examiner*—John Barlow
*Assistant Examiner*—Hien Vo
(74) *Attorney, Agent, or Firm*—LeRoy D. Maunu; Justin Liu

(57) ABSTRACT

A method and apparatus for calibrating a current source to a reference current through the use of 1-bit current comparisons. A temporary current source is first calibrated to the reference current, which allows an input offset current generated by the current comparator to be memorized. The current to be calibrated is then fine-tuned to the temporary current within specified limits, which effectively cancels comparison error that is generated by the input offset current.

38 Claims, 11 Drawing Sheets

METHOD AND APPARATUS FOR CALIBRATING A CURRENT-BASED CIRCUIT

FIELD OF THE INVENTION

The present invention generally relates to current-based circuits, and more particularly to a technique used to calibrate the current-based circuits.

BACKGROUND OF THE INVENTION

The advent of the digital age established, and continues to create, advancements over analog design in such technological categories as computing, communications, and electronic recreation. Access to these technologies, therefore, is becoming increasingly affordable and realizable through digital innovation.

The digital age, however, has not obviated the need for analog circuitry. Consequently, both Analog to Digital Conversion (ADC) and Digital to Analog Conversion (DAC) technologies are very much in demand in order to bridge the gap between the analog and digital worlds.

DAC technologies are required, for example, when digital information is required to control an analog component. Accordingly, control loops often incorporate digital computation circuitry to compare a reference signal with a generated signal in order to calculate a digital error between the two signals. Often, the digital error signal is then applied to an analog correction component, such as a Voltage Controlled Oscillator (VCO) or a Current Controlled Attenuator (CCA), to correct the error. As such, a DAC is then required to convert the digital error signal into an analog form suitable for use by the analog correction component.

Generally speaking, digital to analog conversion is accomplished through the scaling, e.g., division or multiplication, of a reference signal, e.g., voltage, current or charge, into quantized signal segments. Each segment may then be combined in response to an applied input code to form the analog output signal. For an ideal DAC, stepping the input code from all logic zero values to all logic one values renders a rising (or falling) analog staircase waveform having equal magnitude steps. Once the ideal staircase waveform function is smoothed, it forms a perfectly straight line. Each step of the staircase waveform represents a Least Significant Bit (LSB) having a magnitude equal to: LSB=FSR/($2^N$–1), where FSR is the Full Scale Range of the DAC output signal and N is resolution of the DAC in bits.

For a non-ideal DAC, however, Differential Non-Linearities (DNL) and Integral Non-Linearities (INL) perturb the staircase waveform and thus adversely affect the linearity of the DAC. DNL, for example, affects the magnitude of each step, while INL affects the straightness of the staircase waveform when smoothed. Both parameters, therefore, contribute to the inaccuracy of the static code conversion and influence the quality of the dynamic analog output.

While design constraints for the DNL specification may be architecturally relaxed by employing thermometer or segmented structures, the INL specification is fundamentally coupled to the static errors of the analog components that generate the output signal. In order to counteract the static errors, two conventional approaches have been employed. First, an intrinsic DAC design approach is used, which employs large analog devices to reduce the static error to acceptable levels. Alternatively, a calibrated design approach is used, which employs additional calibration logic and operations to improve the linearity.

The calibrated design approach also employs two main techniques for improving linearity. The first technique employs a single parallel CALibrating DAC (CALDAC) to correct the analog output value for each particular input code used. Synchronization problems, however, adversely affect this approach, especially at high speeds.

With the second technique, calibration is instead applied to each individual analog element that is used to produce the output signal, through the use of individual CALDACs, or biasing capacitors. Such calibration schemes use components that sense a difference between a reference and a calibrated element, such as through the use of a single-bit ADC (a comparator) or a multi-bit ADC. However, these components may cause problems due to their substantially unavoidable input offsets.

Conventional input offset cancellation techniques are then employed, whereby the signal being calibrated and the reference signal are applied to the inputs of an ADC during a first measurement. The inputs are then swapped, a second measurement is taken, and a mean value is calculated from the first and second measurements. Such a cancellation approach, however, places stringent accuracy requirements on both the measurement components and the calibrating elements.

SUMMARY OF THE INVENTION

To overcome limitations in the prior art, and to overcome other limitations that will become apparent upon reading and understanding the present specification, the present invention discloses an apparatus and method of calibrating current sources within a current-based electronic circuit.

In accordance with one embodiment of the invention, a method of calibrating a current using a current measurement component comprises adjusting a magnitude of a temporary current to be substantially equal to the sum of a magnitude of a reference current and an offset magnitude of the current measurement component. The method further comprises adjusting a magnitude of the current to be calibrated to be substantially equal to the difference between the adjusted magnitude of the temporary current and the offset magnitude of the current measurement component, such that the adjusted magnitude of the current to be calibrated is substantially equal to the magnitude of the reference current.

In accordance with another embodiment of the invention, a current calibration circuit having an inherent offset comprises first and second current sources that are adapted to provide first and second currents having adjustable magnitudes and a switch circuit that is coupled to receive a reference current and the second current and is adapted to provide the reference current during a first phase and the second current during a second phase. The current calibration circuit further comprises a comparator circuit that is coupled to the switch circuit and coupled to receive the first current, and is adapted to provide a comparison signal. The current calibration circuit further comprises a calibration circuit that is coupled to receive the comparison signal, and is adapted to adjust the first current magnitude to be substantially equal to the sum of the reference current and the inherent offset during the first phase and is adapted to adjust the second current magnitude to be substantially equal to the adjusted magnitude of the first current minus the inherent offset during the second phase. The adjusted magnitude of the second current is substantially void of the inherent offset.

In accordance with another embodiment of the invention, an apparatus implements a method to tune an operational current to a reference current. The method comprises first and second phases of operation. In a first phase of operation, the method performs a first comparison of a reference current with a temporary current, monitors a polarity of the first comparison while incrementally adjusting a magnitude of the temporary current, and records the adjusted temporary current magnitude and the comparison error signal in response to detecting a change in the polarity of the first comparison. In the second phase of operation, the method performs a second comparison of an operational current with a sum of the adjusted temporary current magnitude and the comparison error signal, monitors a polarity of the second comparison while incrementally adjusting a magnitude of the operational current, and records a magnitude of the adjusted operational current in response to detecting a change in the polarity of the second comparison.

In accordance with another embodiment of the invention, a current-steering segmented Digital to Analog Converter (DAC) implements a method of calibrating each thermometer current source to a reference current source. The method comprises comparing the reference current source with a temporary current source to generate a comparison error signal, adjusting a magnitude of the temporary current source to be substantially equal to a sum of the comparison error signal and the reference current source, comparing each thermometer current source with the adjusted temporary current source, and adjusting a magnitude of each thermometer current source to be substantially equal to the difference between the adjusted temporary current source and the comparison error signal.

In accordance with another embodiment of the invention, a programmable current source comprises a coarse current source that is coupled to receive a coarse bias signal and is adapted to generate a coarse current at a current node in response to the coarse bias signal. The programmable current source further comprises a fine current source coupled to the current node and coupled to receive a digital control word. The fine current source is adapted to bi-directionally combine the fine current with the coarse current at the current node in response to the digital control word.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Figure 1:
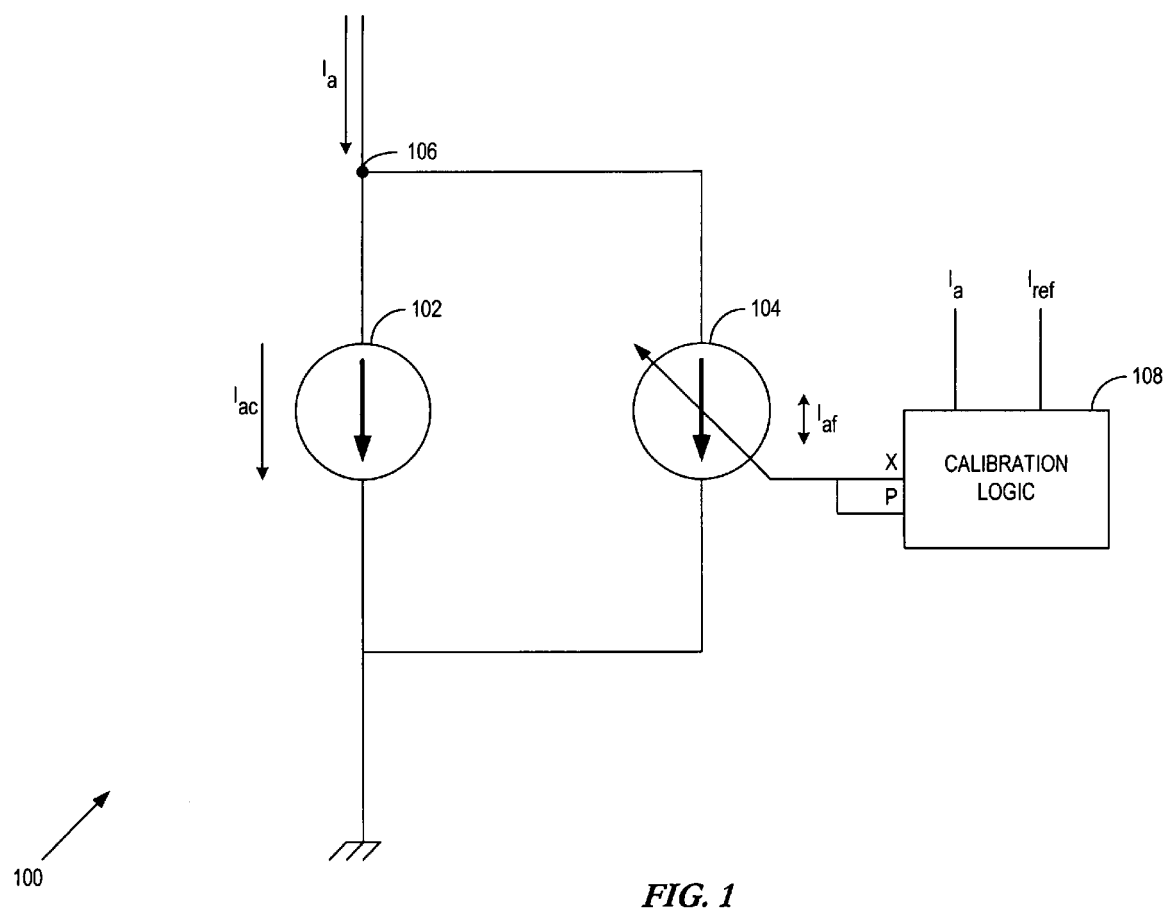
FIG. 1 illustrates an exemplary current calibration scheme in accordance with the present invention.

Generally, the present invention is applied to the calibration of current sources, whereby a current, e.g., $I_a$, is generated in response to a reference current, e.g., $I_{ref}$. FIG. 1 represents symbolic current calibration scheme 100, whereby current $I_a$ is constructed at node 106 by using a combination of a coarse current, $I_{ac}$, and a fine current, $I_{af}$, such that: $I_a = I_{ac} + I_{af}$. Coarse current $I_{ac}$ is generated by coarse current source 102, while fine current $I_{af}$ is generated by a programmable current source, e.g., current source 104. The current generated by current source 104 is controlled by calibration logic 108 via digital word X and polarity indicator P to indicate whether digital word X is positive (P=0) or negative (P=1), i.e., P is indicative of the direction of current $I_{af}$. It should be noted that while coarse current source 102 is generally depicted as a non-programmable current source, those of ordinary skill in the art will recognize that programmable current sources may also be used to implement coarse current source 102.

In one embodiment according to the present invention, calibration logic 108 generates control signals X and P to produce current $I_{af}$ such that:

$I_{af} = (-1)^P * X * I_{afLSB}$, where $I_{afLSB}$ is the LSB step of current source 104, X is the value of the digital word, and P is the polarity bit indicating the direction of current $I_{af}$. Current $I_a$ is then compared to reference current, $I_{ref}$, where $I_a$ is adjusted via fine current $I_{af}$ to be substantially equal to reference current $I_{ref}$ within specified margins. In addition, the polarity P of the current difference between $I_{ref}$ and $I_a$ is sensed by a current comparator (not shown) within calibration logic 108 so that digital word X may remain positive.

Generally, the calibration process in accordance with the present invention begins by fine tuning current $I_a$ as follows. First, digital word X is set to 0, such that the magnitude of current $I_{af}$ is also equal to zero. Next, a comparison is made between the current being tuned, e.g., $I_a$, and the reference current, e.g., $I_{ref}$. A 1-bit information result of the comparison is used to determine the polarity P of the calibrating current $I_{af}$. If P=0, for example, then $I_{af}$ is added to $I_{ac}$. On the other hand, if P=1, then $I_{af}$ is subtracted from $I_{ac}$.

Next, digital word X is incremented by 1, which results in either an $I_{afLSB}$ increase in $I_a$, i.e., P=0, or an $I_{afLSB}$ decrease in $I_a$, i.e., P=1. Another comparison of current $I_a$ and $I_{ref}$ is then made, whereby $I_a$ is considered to be fine tuned if the 1-bit comparison changes from the previous comparison result. Otherwise, if no change occurs, then digital word X is incremented by 1 and another comparison is performed. The process is then repeated until the comparison result of the present iteration differs from the previous comparison result. That is to say, that current $I_a$ is considered to be fine tuned when the logic value at the comparator output either toggles from a logic zero to a logic one, or from a logic one to a logic zero, between subsequent comparisons.

Once fine tuned, calibrated current $I_a$ is equal to the sum of three current components. In particular, $I_a = I_{ref} + I_{offset} + I_q$, where $I_{offset}$ is the input offset current of the comparator (not shown) being used to perform the current comparisons and $I_q$ is a quantization error that is due to the discrete nature of current source 104.

Figure 2:
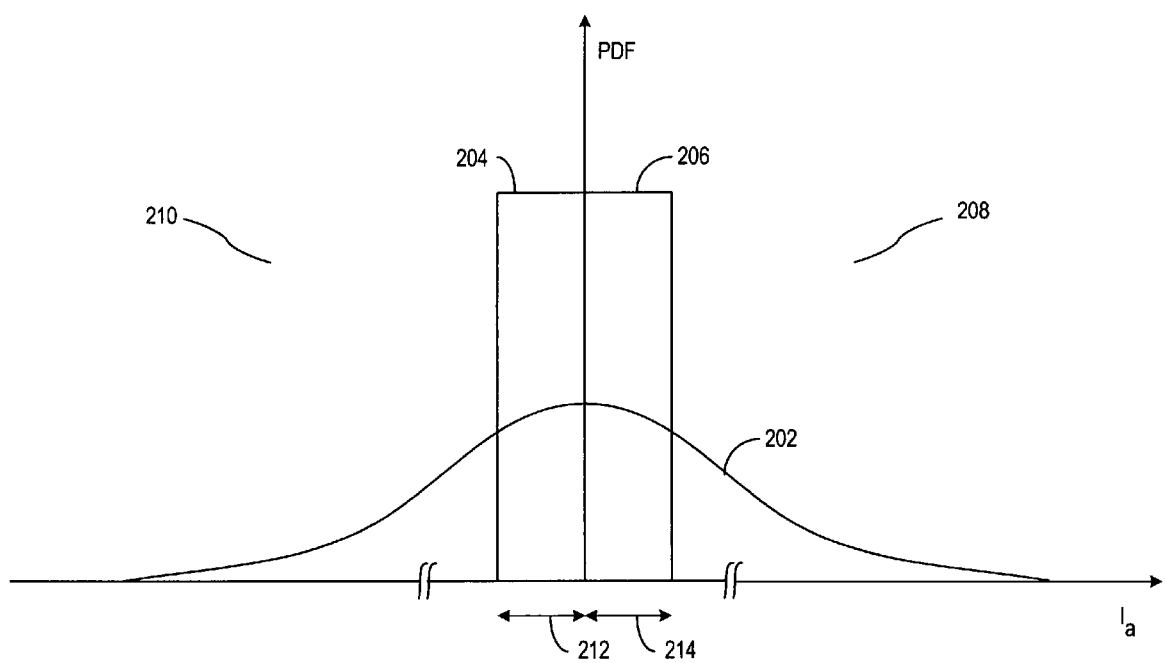
FIG. 2 illustrates Probability Distribution Functions (PDF) of pre-tuned and post-tuned current sources.

The intrinsic matching of current sources that are to be calibrated to a reference current are assumed to comply with a random, uncorrelated, Gaussian Probability Distribution Function (PDF) of the pre-fine-tuned current as exemplified by PDF 202 of FIG. 2. As discussed above in relation to FIG. 1, a current is considered to be fine-tuned when the 1-bit result of the comparison between the tuned current and a reference current differs from the previous comparison.

Assuming that the moment of fine tuning is achieved at time t=mT and that $I_{offset}=0$, then the following expressions given by equation (1) may be observed:

$$I_{ac}+X(mT)*I_{afLSB}>I_{ref}, \text{ for } I_{ac}<I_{ref} \text{ (i.e., P=0); and}$$

$$I_{ac}-X(mT)*I_{afLSB}<I_{ref}, \text{ for } I_{ac}>I_{ref} \text{ (i.e., P=1)} \quad (1)$$

In other words, the difference between the fine-tuned current and the reference current is the quantization error, $I_q$, where $I_q=(I_{ac}+/-X(mT)*I_{afLSB})-I_{ref}$. Further, if $I_{afLSB}$ is taken to be sufficiently small and the expected mean value of the coarse current, $\bar{I}_{ac}$, is taken to be equal to $I_{ref}$, then the resulting post-fine-tune PDF may be assumed to be uniform, with an expected mean value of $\bar{I}_a=\bar{I}_{ac}=I_{ref}$ and a spread of $2*I_{afLSB}$.

One advantage of the present invention, is to reduce the post-fine-tune PDF spread by controlling the sign of $I_q$ for both cases: $I_{ac}<I_{ref}$ (i.e. P=0), and $I_{ac}>I_{ref}$ (i.e. P=1). Negative and positive $I_q$ can be achieved if the polarity, P, of the fine tuning is taken into account. Thus, when $I_{ac}>I_{ref}$ (i.e. P=1) as depicted in region 208, the fine tuning digital word X is represented as X(mT). Conversely, when $I_{ac}<I_{ref}$ (i.e. P=0) as depicted in region 210, the fine tuning digital word X is represented as X((m−1)T).

The fine-tuned current, $I_a$, using negative quantization error may then be described by equation (2) as follows:

$$I_{ac}+X(mT)*I_{afLSB}<I_{ref}, \text{ for } I_{ac}<I_{ref}; \text{ and}$$

$$I_{ac}-X(mT)*I_{afLSB}<I_{ref}, \text{ for } I_{ac}>I_{ref} \quad (2)$$

Thus, by controlling the sign of $I_q$, the resulting post-fine-tune PDF 204 is uniform, but with half the spread 212 equal to $1*I_{afLSB}$, and a mean value that is given by equation (3):

$$\bar{I}_a=I_{ref}-\tfrac{1}{2}\bar{I}_{afLSB} \quad (3)$$

Similarly, fine tuning using positive quantization error yields equation (4) for the tuned current $I_a$ as follows:

$$I_{ac}+X(mT)*I_{afLSB}>I_{ref}, \text{ for } I_{ac}<I_{ref}; \text{ and}$$

$$I_{ac}-X(mT)*I_{afLSB}>I_{ref}, \text{ for } I_{ac}>I_{ref} \quad (4)$$

where the associated post-fine-tune PDF 206 is uniform, having a spread 214 of $1*I_{afLSB}$ and a mean value given by equation (5) as follows:

$$\bar{I}_a=I_{ref}+\tfrac{1}{2}\bar{I}_{afLSB} \quad (5)$$

Figure 3:
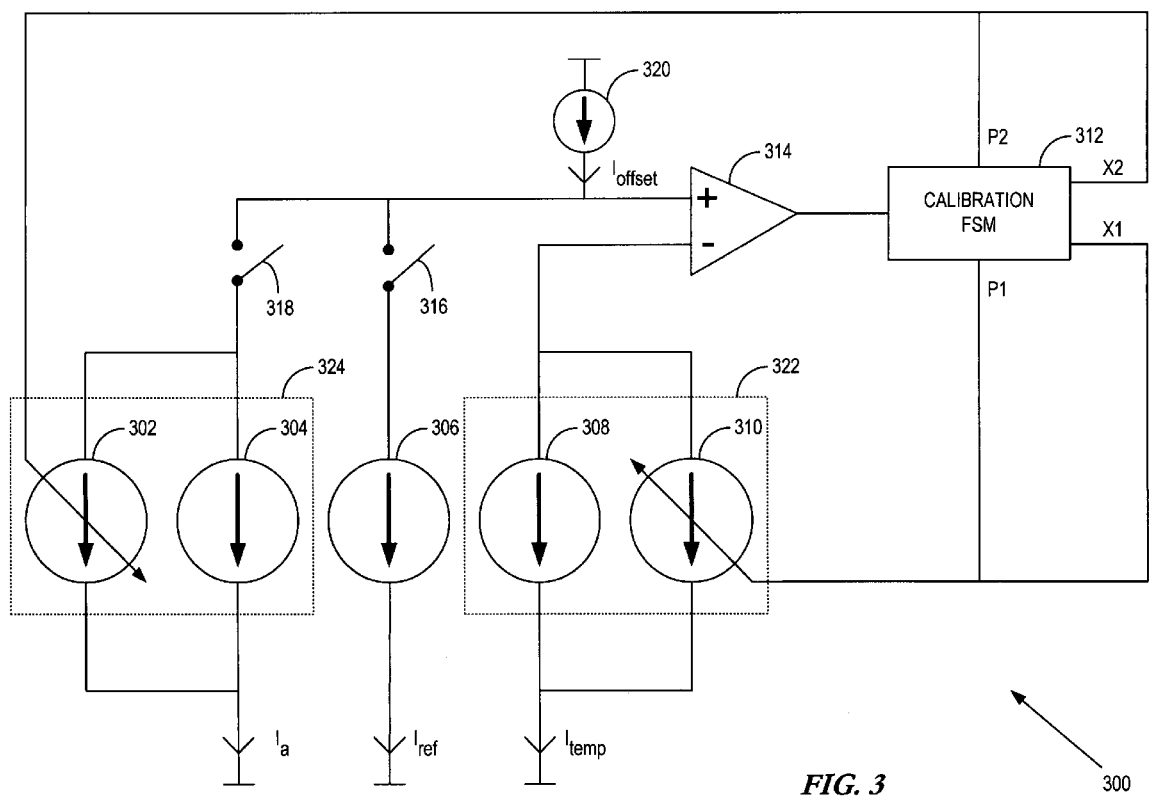
FIG. 3 illustrates an exemplary calibration block diagram in accordance with the present invention.

As discussed above, the present invention utilizes a current comparator to sense a difference between the current being fine tuned, e.g., $I_a$, and the reference current, e.g., $I_{ref}$. The unavoidable input offset current, $I_{offset}$, of the current comparator is compensated by implementing the calibration process in two separate phases, phase A (ΦA) and phase B (ΦB), where each phase represents a separate current tuning process. ΦA implements fine tuning with a negative $I_q$ and ΦB implements fine tuning with a positive $I_q$, operation of which may be exemplified by the high-level calibration block diagram of FIG. 3.

During ΦA, temporary current source 322 generates current $I_{temp}$, such that: $I_{temp}=I_{tempc}+(-1)^{P1}*X_1*I_{tempfLSB}$, where current $I_{tempc}$ is generated by coarse current source 308, P1 is either 0 or 1, $X_1$ is the digital word generated by calibration Finite State Machine (FSM) 312, and $I_{tempfLSB}$ is the LSB step of programmable current source 310. Also, switch 316 is closed while switch 318 remains open during ΦA, so that $I_{temp}$ may be fine-tuned to $I_{ref}$ as generated by current source 306.

Construction of temporary current source 322 is substantially the same as discussed above in relation to FIGS. 1 and 2, where current $I_{temp}$ is fine-tuned to $I_{ref}$ using a negative $I_q$. Due to the input offset current, as depicted by $I_{offset}$ 320 of comparator 314, $I_{temp}$ is fine-tuned to the sum of the reference current, $I_{ref}$, and the comparator input offset current, $I_{offset}$, as described by equation (6):

$$I_{temp}=I_{ref}+I_{offset} \quad (6)$$

where the quantization error, $I_q$, has been discarded for brevity.

During ΦB, switch 316 is opened and switch 318 is closed, thus removing current source 306 and associated reference current, $I_{ref}$, from the calibration circuit. In its place, current source 324 is applied to comparator 314, such that current $I_a$ is then fine-tuned to the previously calibrated value of $I_{temp}$. Current source 324 generates current $I_a$, such that: $I_a=I_{ac}+(-1)^{P2}*X_2*I_{afLSB}$, where coarse current $I_{ac}$ is generated using current source 304, P2 is either 0 or 1, $X_2$ is the digital word generated by calibration Finite State Machine (FSM) 312, and $I_{afLSB}$ is the LSB step of programmable current source 302.

As discussed above in relation to FIGS. 1 and 2, $I_a$ is fine-tuned to the previously calibrated temporary current source 322, with a positive quantization error $I_q$, such that:

$$I_a=I_{temp}-I_{offset} \quad (7)$$

where the quantization error, $I_q$, has been discarded for brevity. Substituting equation (6) into equation (7), an expression of $I_a$ is obtained that is free of comparator input offset, $I_{offset}$, and is referenced to $I_{ref}$ as described by equation (8):

$$I_a=I_{ref}+I_{offset}-I_{offset}=I_{ref} \quad (8)$$

The resulting post-calibration PDF of the calibrated currents is a product of the two fine-tuned PDFs, where the fine-tuned PDF of $I_{temp}$ to $I_{ref}$ using a negative quantization error value is similar to PDF 204 of FIG. 2 and the fine-tuned PDF of $I_a$ to $I_{temp}$ using a positive quantization error value is similar to PDF 206 of FIG. 2. Each post-calibration PDF is uniform having a spread of $1*I_{tempfLSB}$ and $1*I_{afLSB}$, respectively. Each PDF has an offset in its mean value, with regard to the current that it is fine-tuned to, equal to $-\tfrac{1}{2}*I_{tempfLSB}$ and $\tfrac{1}{2}*I_{afLSB}$, respectively. The calibration algorithm according to the present invention inherently compensates for this error by controlling the signs of the mean quantization calibration errors during ΦA and ΦB as described below in more detail.

Figure 4:
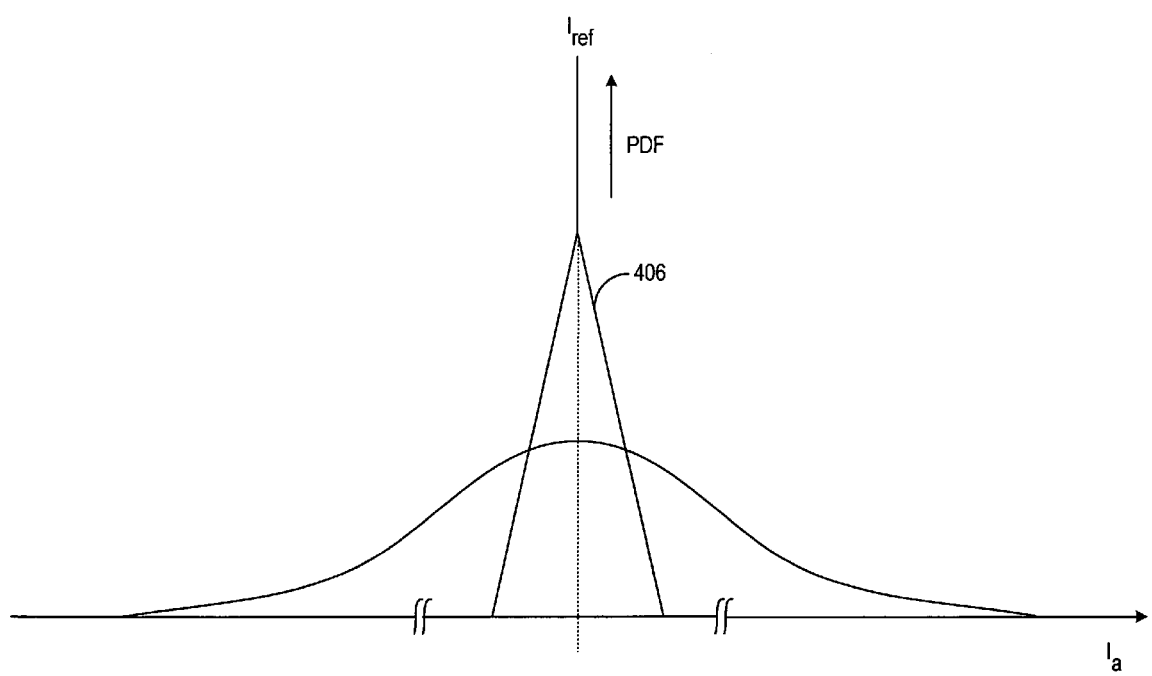
FIG. 4 illustrates an exemplary PDF of a calibrated current source in accordance with the present invention.

For the sake of analysis, the resulting post-calibration PDF takes on a pentagonal shape, i.e., double trapezoidal, mirrored about the $I_{ref}$ axis. The trapezoidal shape can be approximated to a triangular shape, as illustrated by PDF 406 of FIG. 4. The mean value of PDF 406 equals the reference current, $\bar{I}_a=I_{ref}$, where the standard deviation is described by equation (9) as:

$$\sigma_{Ia} = \frac{I_{qfLSB}}{\sqrt{6}} \qquad (9)$$

Those experienced in the art will recognize that calibration circuit 300 preserves its functionality, when temporary current source 322 is connected to the non-inverting input of comparator 314 and current sources 306 and 324 are connected to the inverting input of comparator 314 via switches 316 and 318, provided that all described operations change in sign.

Figure 5:
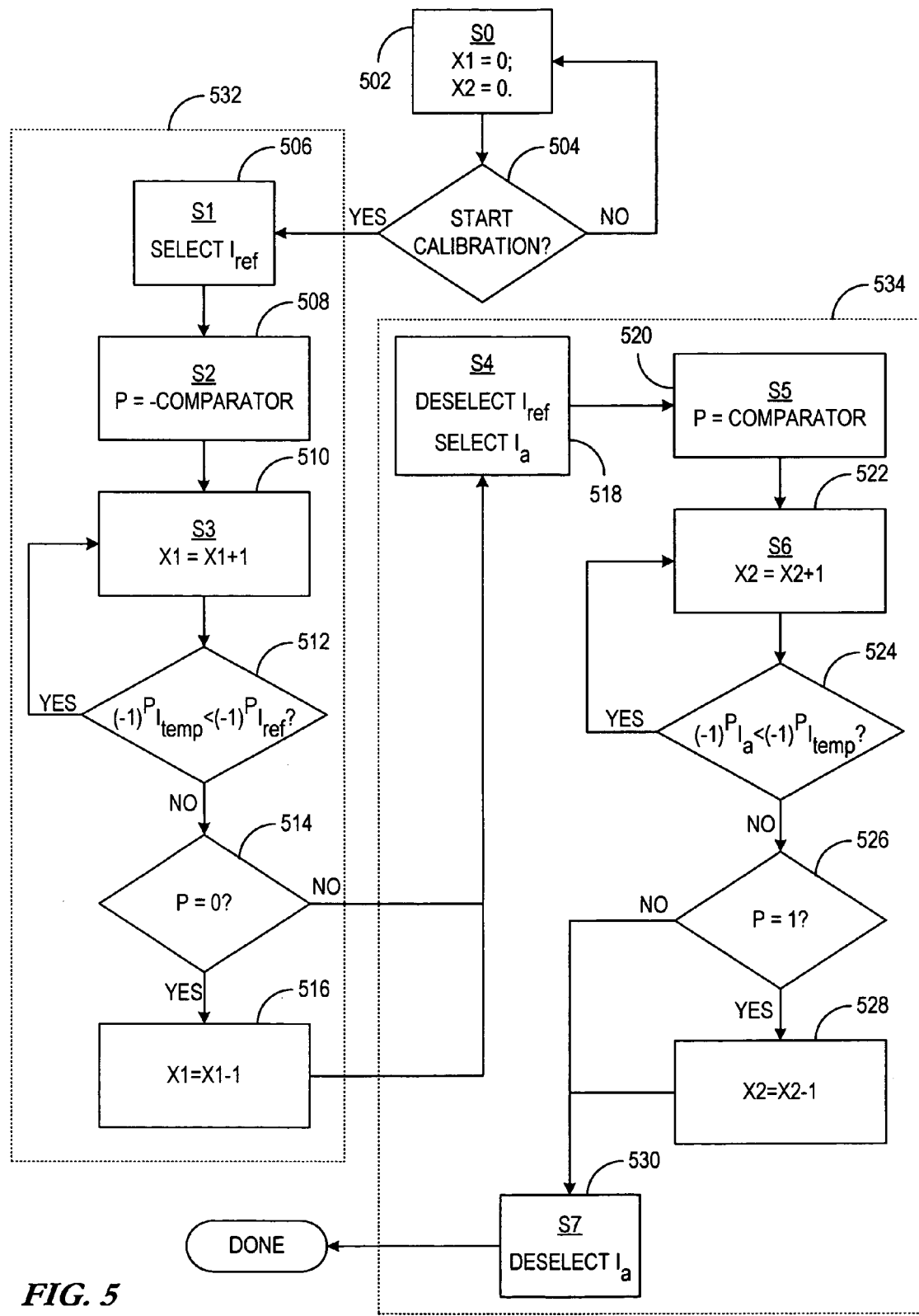
FIG. 5 illustrates an exemplary state transition diagram of a calibration sequence in accordance with the present invention.

Calibration FSM 312 controls the calibration scheme through digital logic that is organized into, for example, 8 executable states as described in Table 1 and exemplified by the state transition diagram of FIG. 5. The executional states of calibration FSM 312 are described in relation to the high-level calibration block diagram exemplified by FIG. 3, in which execution steps 532 exemplifies ΦA operation, i.e., fine tuning using negative quantization error, while execution steps 534 exemplifies ΦB operation, i.e., fine tuning using positive quantization error.

TABLE 1

| STATE | DESCRIPTION |
|---|---|
| S0 | Initial state. All registers set to zero. Waits for calibration start signal to move to S1. |
| S1 | Selects $I_{ref}$ to the non-inverting input of comparator 314. Allows writing measurement values in $I_{temp}$ registers. |
| S2 | Writes the inverted output of comparator 314 to the polarity register. |
| S3 | Tests if the current to be fine tuned ($I_{temp}$) has reached the desired value. If not, digital word X1 is incremented by 1. If the reference value is reached, the polarity bit is checked. If the polarity bit is 0, i.e., fine current $I_{310}$ is being added to coarse current $I_{308}$, the digital word X1 is decreased by one, which fine tunes $I_{temp}$ to $I_{ref}$ with a negative $I_q$. |
| S4 | Deselects $I_{ref}$ and selects $I_a$ to the non-inverting input of comparator 314. Forbids writing measurement values in $I_{temp}$ registers and activates writing measurement values in $I_a$ registers. |
| S5 | Writes the output of comparator 314 to the polarity register. |
| S6 | Tests if the current to be fine tuned ($I_a$) has reached the desired value. If not, digital word X2 is incremented by 1. If the reference value is reached, the polarity bit is checked. If the polarity bit is 1, i.e., fine current $I_{302}$ is being subtracted from coarse current $I_{304}$, the digital word X2 is decreased by one, which fine tunes $I_a$ to $I_{temp}$ with a positive $I_q$. |
| S7 | Final state. Deselects $I_a$ and forbids writing measurement values in $I_a$ registers. |

State S0 502 initializes all measurement registers to 0 and sets the digital words, X1 and X2, to zero. Step 504 determines whether the calibration algorithm is to commence. If so, then state S1 506 is executed, whereby switch 316 is closed and switch 318 is opened to apply current $I_{ref}$ to the non-inverting input of comparator 314. Current $I_{temp}$ is applied to the inverting input of comparator 314, a comparison between $I_{ref}$ and $I_{temp}$ is taken, and the inverted result of the comparison is written to the polarity register of calibration FSM 312 as in execution state 2 508.

Execution state 3 first increments the value of digital word X1 by one as in step 510, which causes the fine current generated by programmable current source 310 to be increased by one LSB step, i.e., the current being fine-tuned, $I_{temp}$, is increased or decreased by one LSB. Next, execution state 3 determines whether the current being fine-tuned, $I_{temp}$, has reached the desired reference value, $I_{ref}$, as in step 512, by checking the output of comparator 314. If the reference value has not been reached, i.e., the output value of comparator 314 has not changed, then steps 510 and 512 are repeated as necessary until the reference value is reached.

Once the reference value is reached, the logical value of polarity bit, P, is checked to determine whether fine current $I_{310}$ is being added to, or subtracted from, coarse current $I_{308}$. If the fine current is being added, as determined by step 514, then digital word X1 is decremented by one, i.e., X1=X((m−1)T), as in step 516 to arrive at a fine-tuned value of $I_{temp}$ using a negative quantization error $I_q$. Otherwise, the final value of digital word X1 is left alone, i.e., X1=X(mT). In either case, the digital word X1 is stored within an $I_{temp}$ register to memorize the final value of digital word X1, which also inherently records the value of the input offset current, $I_{offset}$ 320, that is associated with comparator 314.

Thus in ΦA, $I_{temp}$ is fine-tuned to $I_{ref}$ within a negative $I_q$. In other words, the post-fine-tuned $I_{temp}$ is always smaller than $I_{ref}$, regardless of its pre-fine-tuned value. In such a way, the post-fine-tuned $I_{temp}$ can be approximated as a stochastical value with a uniform distribution, a mean value of $\bar{I}_{temp} = I_{ref} - \frac{1}{2}I_{LB310}$, and a spread of $I_{LSB310}$, where $I_{LSB310}$ is the LSB step value of programmable current source 310.

ΦB then begins with step 518, where execution state 4 is executed, which first deselects current $I_{ref}$ from the non-inverting input of comparator 314 and selects current $I_a$ instead, by closing switch 318 and opening switch 316. Next, a comparison between $I_a$ and the calibrated value of $I_{temp}$ is taken, and the result is written to the polarity register of calibration FSM 312 as in execution state 5 of step 520. A non-inverted comparison result is required here, since the current being fine tuned, $I_a$, is being applied to the non-inverting input of comparator 314, whereas the current being tuned in ΦA, $I_{temp}$, was applied to the inverting input of comparator 314. The value of digital word X2 is incremented by one as in execution state 6 of step 522, which causes the fine current generated by programmable current source 302 to be increased by one LSB step, i.e., the current being fine-tuned, $I_a$, is increased or decreased by one LSB.

Next, execution state 6 determines whether the current being fine-tuned, $I_a$, has reached the desired reference value, $I_{temp}$, as in step 524. If the reference value has not been reached, i.e., the output value of comparator 314 has not changed, then steps 522 and 524 are repeated as necessary until the reference value is reached.

Once the reference value is reached, the logical value of polarity bit, P, is checked to determine whether fine current $I_{302}$ is being added to, or subtracted from, coarse current $I_{304}$. If the fine current is being subtracted, as determined by step 526, then digital word X2 is decremented by one, i.e., X2=X((m−1)T), as in step 528 to arrive at a fine-tuned value of $I_a$ using a positive quantization error $I_q$. Otherwise, the value of digital word X2 is left alone, i.e., X2=X(mT), the value of X2 is then written to an $I_a$ register to memorize the value of X2 required to fine tune $I_a$ to $I_{temp}$, and the calibration algorithm concludes by de-selecting current $I_a$ as in step 530.

Thus in ΦB, $I_a$ is fine-tuned to the calibrated value of $I_{temp}$ within a positive $I_q$. In other words, the post-fine-tuned $I_a$ is always greater than $I_{temp}$, regardless of its pre-fine-tuned value. In such a way, the post-fine-tuned $I_a$ can be approximated as a stochastical value with a uniform distribution, a mean value of $\bar{I}_a = I_{temp} + \frac{1}{2}I_{LSB302}$, and a spread of $I_{LSB302}$, where $I_{LSB302}$ is the LSB step value of programmable current source 302. It can be seen, therefore, that through ΦA and ΦB operation, expressions for $\bar{I}_a$ and $\bar{I}_{temp}$ are combined as in equation (8) to automatically cancel both the input offset current of comparator 314 and the mean quantization error.

The state transition diagram of FIG. 5 exemplifies a method according to the present invention of fine tuning a temporary current source to a reference current source using a negative quantization error, followed by fine tuning the current source to be calibrated to the temporary current source using a positive quantization error. It should be noted, however, that the reverse process likewise produces the desired result. That is to say that fine tuning a temporary current source to a reference current source using a positive quantization error, followed by fine tuning the current source to be calibrated to the temporary current source using a negative quantization error is also a viable alternative.

Figure 6:
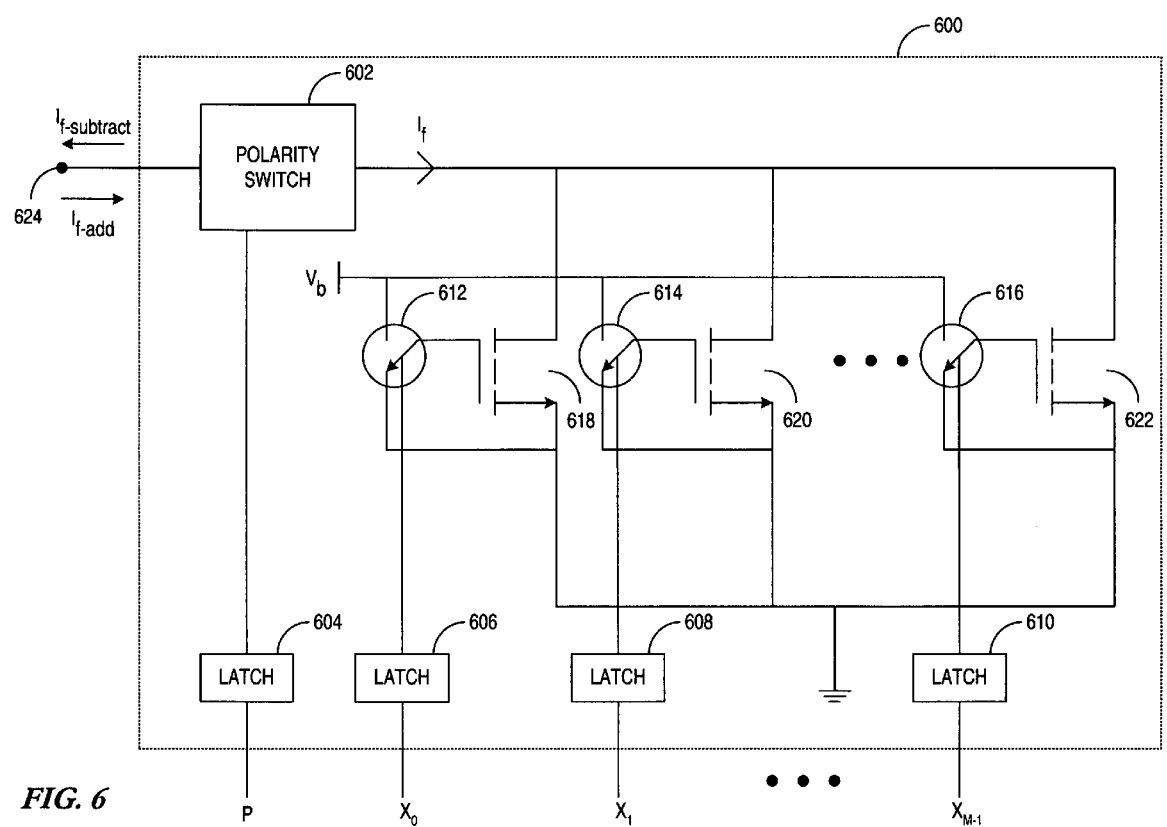
FIG. 6 illustrates an exemplary schematic of a CALibrating Digital to Analog Converter (CALDAC) in accordance with the present invention.

In an exemplary embodiment, programmable current sources 302 and 310 may be implemented using CALDACS as exemplified by CALDAC schematic 600 of FIG. 6. CALDAC 600 represents an M-bit CALDAC having latches 606–610 to store the digital CALDAC word: $X=[X_0(nT), X_1(nT), \ldots, X_{M-1}(nT)]$ at time nT. $X_0(nT)$ represents the LSB at time nT of the digital CALDAC word, while $X_{M-1}(nT)$ represents the Most Significant Bit (MSB) at time nT of the digital CALDAC word.

The magnitude of the fine current, $I_f$, is determined by the logic value of the digital CALDAC word at time nT. In particular, transistors 618–622 are rendered conductive by the logic value of their respective control bits (e.g., via switches 612–616, which may be controlled by latches 606–610). For example, if the gates of N-type Metal Oxide Semiconductor (NMOS) transistors 618–622 are connected to ground potential, such that the gate-to-source voltage, $V_{GS}$, is below their respective voltage thresholds, $V_{th}$, then NMOS transistors 618–622 are switched off, thus nullifying $I_f$.

If, on the other hand, the gates of NMOS transistors 618–622 are connected to terminal $V_b$, such that the gate-to-source voltage, $V_{GS}$, is greater than or equal to their respective voltage thresholds, $V_{th}$, then NMOS transistors 618–622 are rendered conductive, thus maximizing $I_f$. Thus, $I_f$ may take on $2^M$ different magnitude levels depending upon the conductive state of NMOS transistors 618–622 as controlled by the value of the digital CALDAC word X.

Figure 7:
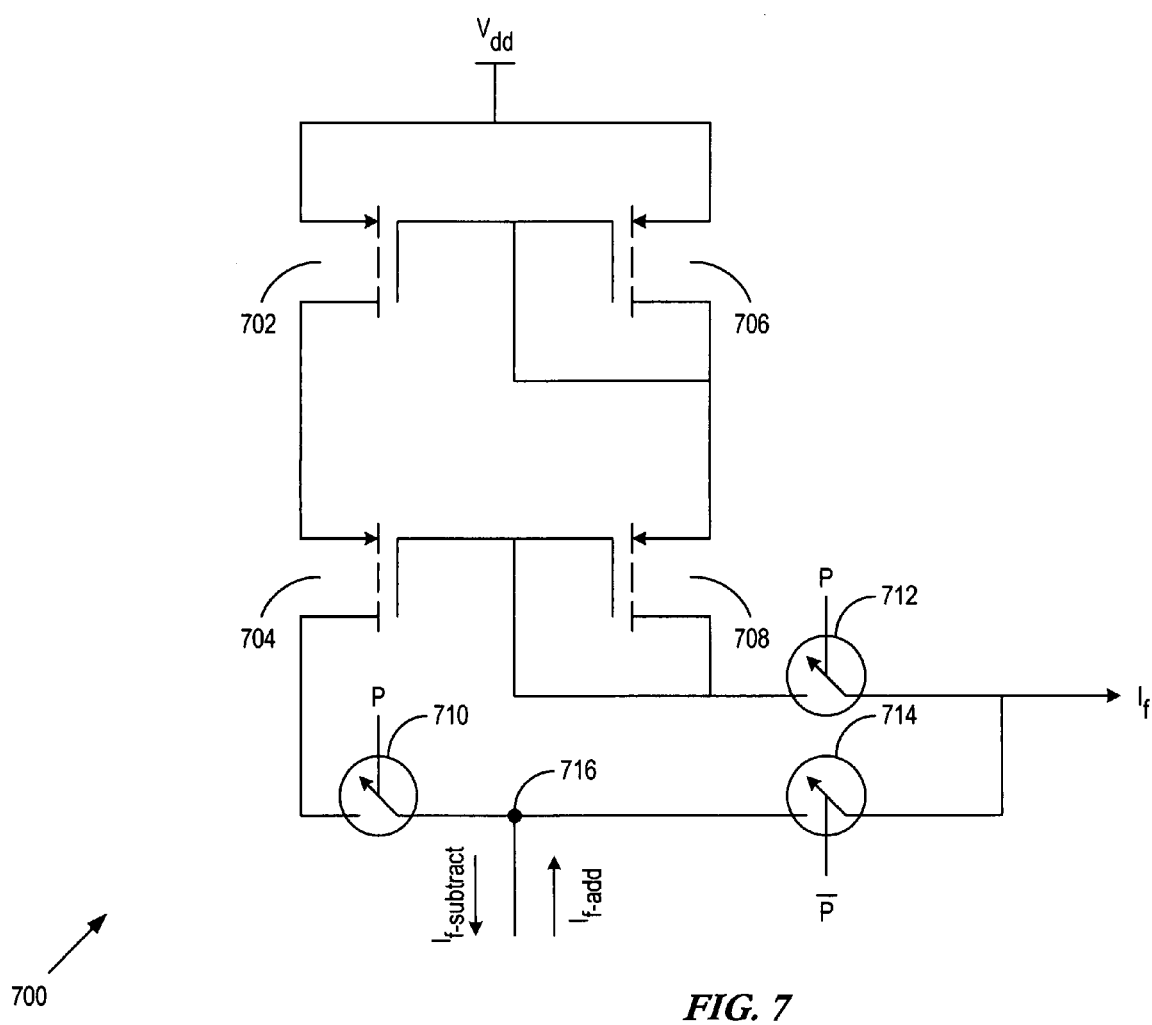
FIG. 7 illustrates an exemplary schematic of the polarity switch of FIG. 6.

CALDAC 600 may provide a subtracting fine current, $I_{f\text{-}subtract}$, or an additive fine current, $I_{f\text{-}add}$, depending upon the logic value of polarity bit, P, which is subsequently stored by latch 604. Turning to polarity switch schematic 700 of FIG. 7, it is verified that given a logic value of polarity bit P equal to 1, a current mirror is activated, such that subtracting fine current, $I_{f\text{-}subtract}$, is generated by polarity switch 700 at node 716. Conversely, given a logic value of polarity bit P equal to 0, the current mirror is deactivated, such that additive fine current, $I_{f\text{-}add}$, is received by polarity switch 700 from node 716. In either case, the magnitude of fine currents $I_{f\text{-}subtract}$ and $I_{f\text{-}add}$ is substantially equal to the magnitude of $I_f$.

In particular, the current conducted by PMOS transistors 706 and 708 is mirrored by the current conducted by PMOS transistors 702 and 704, respectively, when P=1, since transistor pairs 702/706 have identical $V_{GS}$. When the value of polarity bit P is at a logic 1, for example, switches 710 and 712 are closed, while switch 714 remains open. Thus, a current equal to the magnitude of $I_f$ is conducted by transistors 706/708 and switch 712, while an equal magnitude current is mirrored by transistors 702 and 704 to produce current, $I_{f\text{-}subtract}$, from polarity switch 700 at node 716.

Conversely, when the value of polarity bit P is a logic 0, switches 710 and 712 are open, while switch 714 remains closed, thus bypassing the current mirror, such that current $I_{f\text{-}add}$ is received by polarity switch 700 at node 716 and conducted by switch 714.

It can be seen, therefore, that when CALDAC 600 is substituted in place of programmable current source 104 of FIG. 1, CALDAC 600 bi-directionally combines with current source 102 to calibrate current $I_a$ at node 106 to the desired level, e.g., $I_{ref}$. In particular, when CALDAC 600 is in an additive mode, i.e., P=0, then current $I_a$ is increased to compensate for the additional amount of current, e.g., $I_{f\text{-}add}$, required by CALDAC 600 from node 106. Conversely, when CALDAC 600 is in a subtractive mode, i.e., P=1, then current $I_a$ is decreased to compensate for the additional amount of current, e.g., $I_{f\text{-}subtract}$, supplied to node 106 by CALDAC 600.

Figure 8:
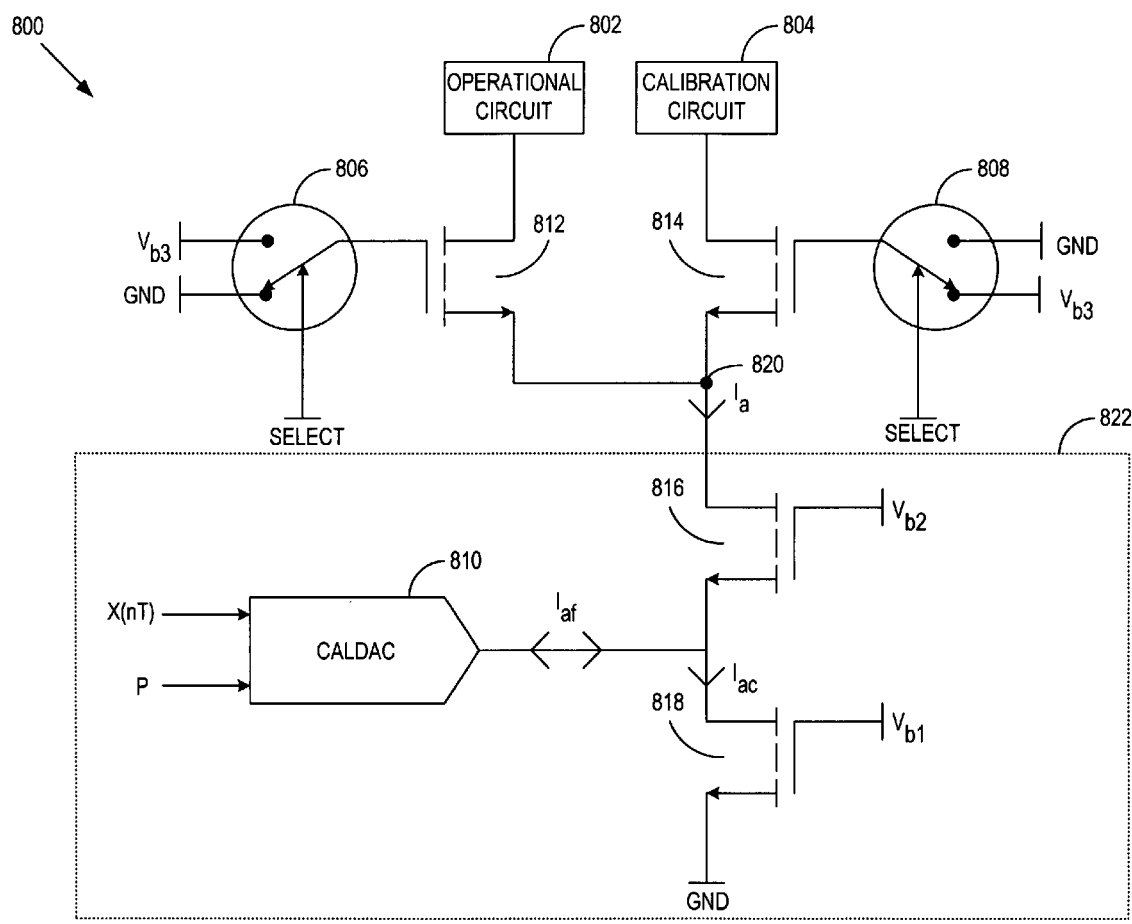
FIG. 8 illustrates an exemplary transistor implementation of a self-calibrating current source in accordance with the present invention.

Referring to FIG. 8, an exemplary transistor implementation of self-calibrating current source 800 according to the present invention is illustrated, where CALDAC 810 may be exemplified by CALDAC 600 of FIG. 6. Programmable current source 822 is suitable for use with calibration circuit 804 during a calibration phase of self-calibrating current source 800. Signal SELECT, during the calibration phase, interoperates with switch 808 to render transistor 814 conductive by applying bias signal, $V_{b3}$, to the gate terminal of transistor 814. At the same time, transistor 812 is rendered non-conductive by signal SELECT, since a reference potential, e.g., GND, is applied to the gate terminal of transistor 812 through the operation of switch 806. Once calibrated, programmable current source 822 is suitable for use with operational circuit 802 simply by switching the polarity of signal SELECT.

Transistors 816, 818 and CALDAC 810 combine to form programmable current source 822. Transistor 818 operates to generate the coarse current, $I_{ac}$, while CALDAC 810 operates to provide the bi-directional fine current, $I_{af}$, as discussed above. Transistor 818 is implemented in one embodiment as an N-type MOS (NMOS) transistor to save area, reduce capacitance, and gain voltage head room over its PMOS counterpart. The voltage head room gained allows the addition of cascode transistor 816, to effectively increase the output impedance of programmable current source 822, as well as to provide other advantages.

First, use of transistor 816 allows the design constraints of transistor 818 to be relaxed. In particular, the channel area of transistor 818, due to the calibration algorithm of the present invention, is allowed to be reduced to a value smaller than would normally be used without calibration. The reduced channel area, however, results in a lower output impedance than would normally be required by programmable current source 822. Hence, use of transistor 816 increases the output impedance of programmable current source 822 to a level that is acceptable.

Second, transistor 816 serves to isolate the generation of current $I_a$, i.e., the sum of currents $I_{ac}$ and $I_{af}$ from current switches 812 and 814. Current switch 814 is rendered conductive during calibration of programmable current source 822, while current switch 812 is rendered conductive during the operational use of programmable current source 822. Accordingly, matching errors between transistors 812 and 814 provide a source of the matching error for current $I_a$, where the offset mismatch between transistors 812 and 814 is largely due to the $V_{th}$ mismatch between transistors 812 and 814. The effects of the $V_{th}$ mismatch, however, are decreased by operation of transistor 816, since the voltage mismatch at node 820 is transformed to a current matching error of $I_a$ via the output impedance structure of transistors 816 and 818.

Figure 9:
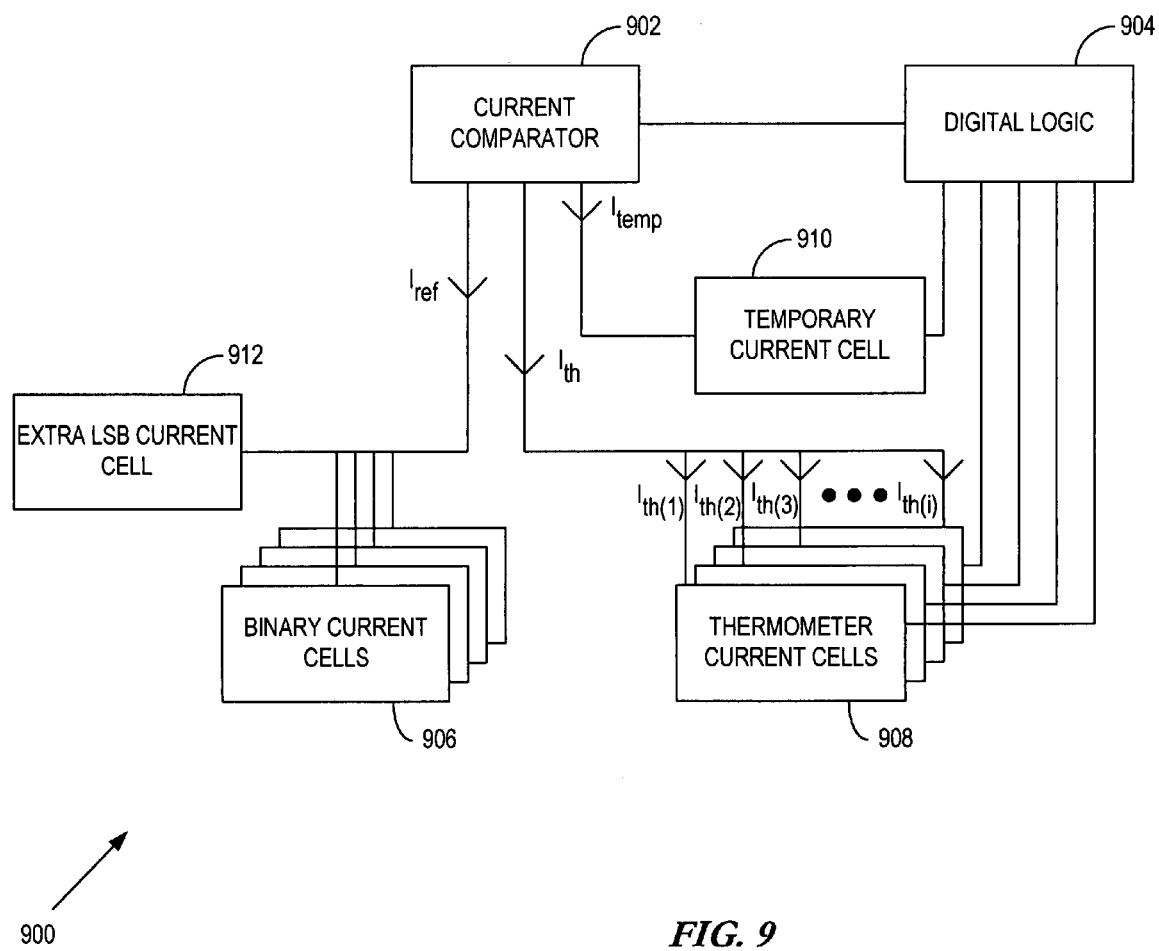
FIG. 9 illustrates an exemplary segmented DAC calibration block diagram in accordance with the present invention.

As discussed above, the present invention is contemplated for use by any current-based electronic circuit such as the segmented DAC calibration circuit 900 as exemplified in FIG. 9. Thermometer current cells 908 and temporary current cell 910 may be exemplified by programmable current cell 822 of FIG. 8, whereby each thermometer current cell 908 and temporary current cell 910 is implemented with an integrated, bi-directional CALDAC 810 and whereby the implementation of the temporary current cell does not require transistor 812, the switch 806, and a connection to the operational circuit 802. Binary current cells 906 are substantially equivalent to thermometer current cells 908, except that binary current cells 906 do not incorporate an integrated CALDAC and share common circuitry with respect to switch 808, transistor 814, and a connection to the calibration circuit 804. Extra LSB current cell 912 is substantially equivalent to binary current cells 906, except that extra LSB current cell 912 does not incorporate circuitry 812 and 806 connecting it to operational circuit 802.

Current comparator 902 represents a single-bit ADC, which is used as a measuring device to compare current $I_{temp}$ with $I_{ref}$. $I_{ref}$ being formed by the combination of binary current cells 906 with one extra LSB current cell 912, in a first phase of operation and to selectively compare each of thermometer currents, $I_{th(i)}$, with current $I_{temp}$ in a second phase of operation as discussed in more detail below. Individual CALDACs integrated within thermometer current cells 908 and temporary current cell 910 are controlled by digital logic 904 in response to the 1-bit comparisons made by current comparator 902.

Figure 10:
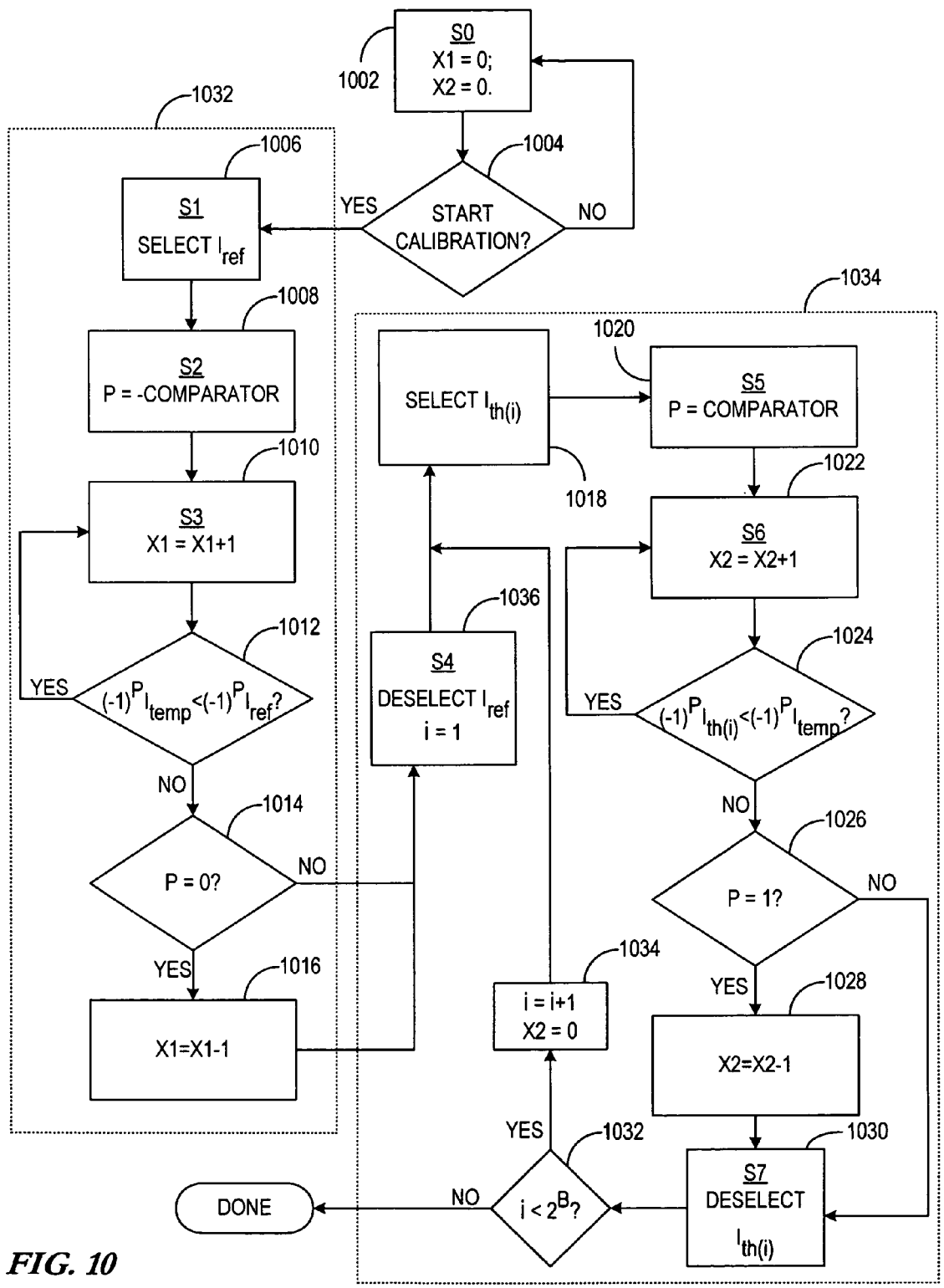
FIG. 10 illustrates an exemplary state transition diagram of a segmented DAC calibration sequence in accordance with the present invention.

Table 2 along with the state transition diagram of FIG. 10 provides a more detailed description of the operation of segmented DAC calibration circuit 900. The algorithm may be used, for example, to calibrate each current cell of a segmented, current-steering DAC in accordance with the present invention.

TABLE 2

| STATE | DESCRIPTION |
|---|---|
| S0 | Initial state. All registers set to zero. Waits for calibration start signal to move to S1. |
| S1 | Selects $I_{ref}$ to the non-inverting input of current comparator 902, where $I_{ref}$ is the sum of binary current cells 906 plus one LSB current 912. |
| S2 | Writes the inverted output of current comparator 902 to the polarity register of digital logic block 904. |
| S3 | Tests if the current to be fine tuned ($I_{temp}$) has reached the desired value. If not, the digital CALDAC word controlling the integrated CALDAC of temporary current cell 910 is incremented by 1. If the reference value is reached, the polarity bit is checked. If the polarity bit is 0, i.e., fine current $I_{tempf}$ is being added to coarse current $I_{tempc}$, the digital CALDAC word is decreased by one, which fine tunes $I_{temp}$ to $I_{ref}$ with a negative $I_q$. |
| S4 | Sets the index register i to 1. Deselects $I_{ref}$ and selects $I_{th(i)}$ to the non-inverting input of current comparator 902. Forbids writing measurement values in $I_{temp}$ registers and activates writing measurement values in $I_{th(i)}$ registers. |
| S5 | Writes the output of current comparator 902 to the polarity register of digital logic block 904. |
| S6 | Tests if the current to be fine tuned ($I_{th(i)}$) has reached the desired value. If not, the digital CALDAC word controlling the integrated CALDAC of thermometer current cell, i, is incremented by 1. If the reference value is reached, the polarity bit is checked. If the |

TABLE 2-continued

| STATE | DESCRIPTION |
|---|---|
| | polarity bit is 1, i.e., calibrating current $I_{th(i)f}$ is being subtracted from coarse current $I_{th(i)c}$, the digital CALDAC word is decreased by one, which fine tunes $I_{th(i)}$ to $I_{temp}$ with a positive $I_q$. |
| S7 | Final state. Deselects $I_{th(i)}$ and forbids writing measurement values in $I_{th(i)}$ registers. Checks the index register to determine if the number of segmented current sources, i.e., thermometer current cells 908, have been calibrated. If yes, then the calibration algorithm is terminated. If no, then the index register is incremented by 1, $I_{th}(i)$ is selected, and activates writing measurement values in $I_{th(i)}$ registers. States S5 and S6 are repeated as necessary. |

Calibration ΦA 1032 begins with state S1 1002 by initializing all measurement registers to 0 and sets the digital CALDAC words, X1 and X2, to zero. Step 1004 determines whether the calibration algorithm is to commence. If so, then state S1 1006 is executed, whereby current $I_{ref}$ is applied to the non-inverting input of current comparator 902. Current $I_{temp}$ is applied to the inverting input of current comparator 902, a comparison between $I_{ref}$ and $I_{temp}$ is taken, and the inverted result of the comparison is written to the polarity register of digital logic block 904 as in execution state 2 1008.

Execution state 3 first increments the value of digital CALDAC word X1 by one as in step 1010, which causes the fine current generated by the CALDAC of temporary current cell 910 to be increased or decreased by one LSB step. Next, execution state 3 determines whether the current being fine-tuned, $I_{temp}$, has reached the desired reference value, $I_{ref}$, as in step 1012, by checking the output of current comparator 902. If the reference value has not been reached, i.e., the output bit of current comparator 902 has not toggled, then steps 1010 and 1012 are repeated as necessary until the reference value is reached.

Once the reference value is reached, the logical value of polarity bit, P, within digital logic block 904 is checked to determine whether fine current $I_{tempf}$ is being added to, or subtracted from, coarse current $I_{tempc}$ of temporary current cell 910. If the fine current is being added, as determined by step 1014, then digital CALDAC word X1 is decremented by one, i.e., X1=X((m−1)T), as in step 1016 to arrive at a fine-tuned value of $I_{temp}$ using a negative quantization error $I_q$. Otherwise, the final value of digital CALDAC word X1 is left alone, i.e., X1=X(mT). In either case, the digital CALDAC word X1 is stored within an $I_{temp}$ register to memorize the final value of digital CALDAC word X1, which also inherently records the value of the input offset current that is associated with current comparator 902.

ΦB 1034 then begins with step 1036, where execution state 4 is executed, which first deselects current $I_{ref}$ from the non-inverting input of current comparator 902 and sets thermometer current cell selection index, i, to 1. Step 1018 then selects $I_{th(i)}$ to the non-inverting input of current comparator 902. Next, a comparison between $I_{th(i)}$ and $I_{temp}$ is taken, and the result is written to the polarity register of logic block 904 as in step 1020. An non-inverted comparison result is required here, since the current being fine tuned, $I_{th(i)}$, is being applied to the non-inverting input of current comparator 902, whereas the current being tuned in ΦA, $I_{temp}$, was applied to the inverting input of current comparator 902. The value of digital CALDAC word X2 is incremented by one as in step 1022, which causes fine current $I_{th(i)f}$ to be increased by one LSB step.

Next, execution state 6 determines whether the current being fine-tuned, $I_{th(i)}$, has reached the desired reference value, $I_{temp}$, as in step 1024. If the reference value has not been reached, i.e., the output bit of current comparator 902 has not toggled, then steps 1022 and 1024 are repeated as necessary until the reference value is reached.

Once the reference value is reached, the logical value of polarity bit, P, within digital block 904 is checked to determine whether fine current $I_{th(i)f}$ is being added to, or subtracted from, coarse current $I_{th(i)c}$. If the fine current is being subtracted, as determined by step 1026, then digital CALDAC word X2 is decremented by one, i.e., X2=X((m=1)T), as in step 1028 to arrive at a fine-tuned value of $I_{th(i)}$ using a positive quantization error $I_q$. Otherwise, the value of digital CALDAC word X2 is left alone, i.e., X2=X(mT), the value of X2 is then written to an $I_{th(i)}$ register to memorize the value of X2 required to fine tune $I_{th(i)}$ to $I_{temp}$.

Current $I_{th(i)}$ is deselected as in step 1030 and the value of the thermometer current cell selection index, i, is compared to the number of thermometer current segments existing within thermometer current cells 908. If thermometer current cells have been left uncalibrated as determined in step 1032, then the thermometer current cell selection index, i, is incremented and the digital CALDAC word X2 is initialized to 0 as in step 1034. The ΦB calibration process then repeats for each current source existing within thermometer current cells 908, otherwise, the calibration process of ΦB 1034 terminates when all thermometer current cells have been calibrated.

Thus, multiple thermometer current sources are calibrated to a common reference current to reduce the mismatch among them. ΦA is executed only once, while ΦB is executed once for each thermometer current source that is to be calibrated. As such, a considerable amount of circuitry may be shared including: the current comparator, the temporary current source, and the calibration logic. It can be seen, therefore, that through ΦA and ΦB operation, expressions for $\bar{I}_{th(i)}$ and $\bar{I}_{temp}$ are combined as in equation (8) to automatically cancel both the input offset current of current comparator 902 and the mean quantization error.

The calibration techniques and associated embodiments discussed above may be characterized as "start-up" calibration embodiments, whereby the calibration algorithm is executed once before startup and the calibration results are then stored for use during normal operation. In a Complementary MOS (CMOS) application, however, the storage elements used to store the calibration results may require a significant percentage of the total semiconductor chip area required by the programmable current source. In addition, slow varying errors may not be accounted for, since that may occur during normal DA conversion.

Figure 11:
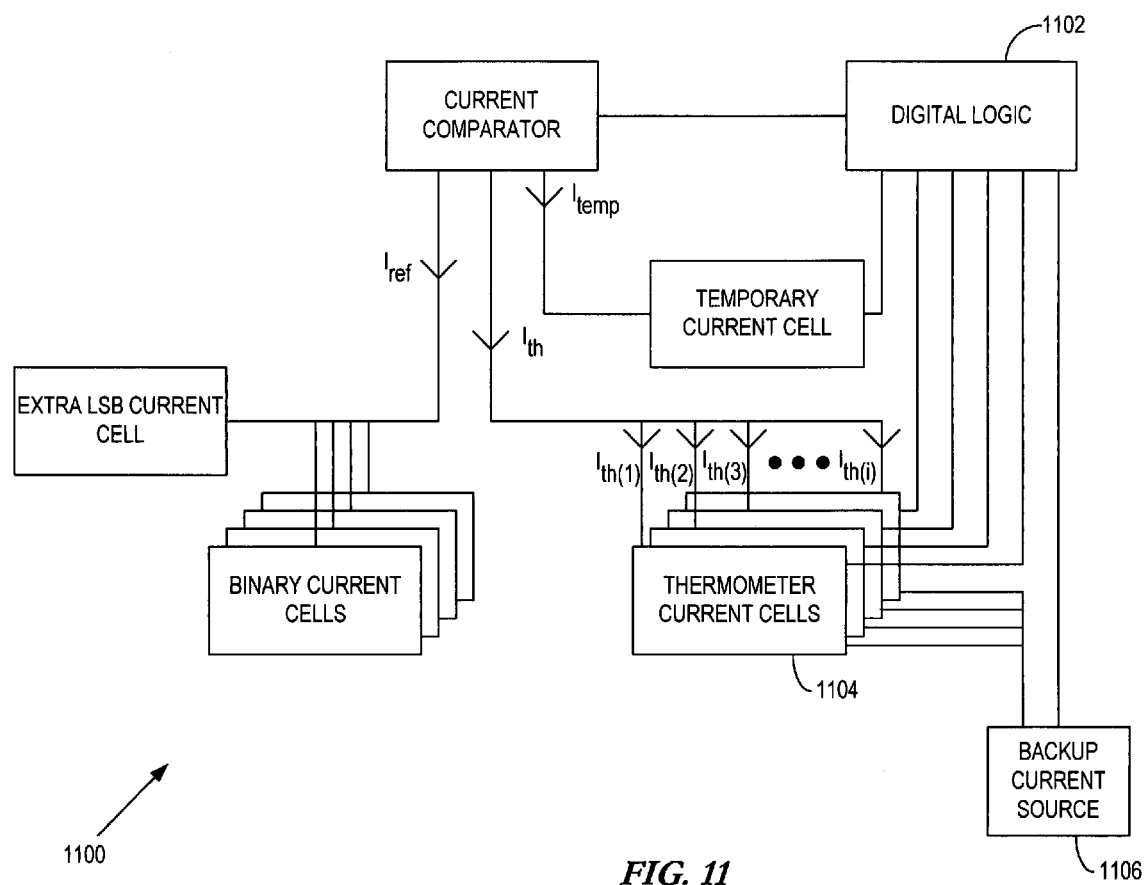
FIG. 11 illustrates an alternate segmented DAC calibration block diagram in accordance with the present invention.

In an alternate embodiment according to the present invention, therefore, segmented DAC calibration circuit 1100 as exemplified in FIG. 11 may be used. Such an embodiment may be desired when calibration processes are required to be executed in background mode during normal operation of the segmented DAC.

In particular, a single backup current source 1106 is added to thermometer current cells 1104, such that when thermometer current cell, i, of thermometer current cells 1104 is selected for calibration, the corresponding current, $i_{th(i)}$, is supplied by backup current source 1106. In such an instance, the memory elements used to store the results of the calibration measurements may be implemented as capacitors, thus obviating the need for calibration registers.

In addition, current discharge associated with the capacitors is tolerable to an extent, since they are used in the digital domain. Thus, ΦA of the calibration algorithm may be executed at startup, while ΦB of the calibration algorithm may take place during normal operation of the DAC in background mode to remove errors generated through normal DA conversion via background calibration.

Through calibration, the present invention sets forth a method and apparatus of increasing the accuracy of current-based electronic circuits without the need to use large-area unit current sources to reduce the intrinsic error. In addition, the present invention obviates the need to enforce stringent accuracy requirements on the calibrating components themselves.

In the case of a DAC, for example, the DC accuracy of the DAC is defined by its INL, the statistical maximum value of which, can be expressed by the relative matching of its current sources for a 3σ confidence level as set forth by equation 10:

$$INL_{\max} = 3\sqrt{2^{N-1}} \left[ \frac{\sigma_u}{\bar{I}_u} \right] \quad (10)$$

where N is the DAC resolution, $\sigma_u$ is the standard deviation of a unit current source, and $\bar{I}_u$ is the expected mean value current of the unit element.

It can be shown from equation (10) along with known matching vs. area relationships, that to increase the DC accuracy of a DAC by 1-bit, for example, it is necessary to increase the area of the unit-element current sources by a factor of 4. Thus, intrinsic DACs must use large-area unit current sources, which are on the order of 20–30 μm² for today's Complementary MOS (CMOS) processes, to obtain the required bit resolution.

In accordance with the present invention, on the other hand, lower accuracy cores may be utilized, while maintaining desired accuracy through calibration. Prior to calibration, for example, a particular DAC may exhibit a 10 bit accuracy, since its INL may stay within a 2-LSB limit. After applying the calibration technique in accordance with the present invention, the accuracy of the DAC may be increased to a 12-bit level, since the calibrated INL won't exceed the 0.5 LSB limit. Thus, while smaller current sources may be used to reduce the amount of semiconductor chip area needed for their implementation, calibration in accordance with the present invention may be used to increase the bit accuracy of the DAC, while preserving the semiconductor chip area savings realized through use of the smaller current sources.

The present invention is believed to be applicable in a variety of current-calibration applications. In particular, although the calibration circuits disclosed herein have been discussed in relation to IC applications using MOS processes, in particular NMOS current source based circuits, one of ordinary skill in the art will recognize relevant application to PMOS current source based circuits, bipolar IC processes, and discrete applications as well. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of calibrating a current using a single-bit current measurement component, comprising:
   adjusting a magnitude of a temporary current to be substantially equal to a sum of a magnitude of a reference current and an offset magnitude of the single-bit current measurement component;
   adjusting a magnitude of the current to be calibrated to be substantially equal to a difference between the adjusted magnitude of the temporary current and the offset magnitude of the single-bit current measurement component, such that the adjusted magnitude of the current to be calibrated is substantially equal to the magnitude of the reference current; and
   applying the reference current to a non-inverting input of the single-bit current measurement component.

2. The method according to claim 1, wherein adjusting the magnitude of the temporary current comprises:
   initializing a temporary current control word to zero; and
   sequentially incrementing the temporary current control word by one until the temporary control word is indicative of the adjusted magnitude of the temporary current.

3. The method according to claim 2, further comprising storing the temporary current control word.

4. The method according to claim 3, wherein storing the temporary current control word inherently stores the offset magnitude of the single-bit current measurement component.

5. The method according to claim 1, further comprising applying the temporary current to an inverting input of the single-bit current measurement component while adjusting the magnitude of the temporary current.

6. The method according to claim 5, further comprising:
   removing the reference current from the non-inverting input of the single-bit current measurement component; and
   applying the current to be calibrated to the non-inverting input of the single-bit current measurement component while adjusting the magnitude of the current to be calibrated.

7. The method according to claim 6, wherein adjusting the magnitude of the current to be calibrated comprises:
   initializing a calibrated current control word to zero; and
   sequentially incrementing the calibrated current control word by one until the calibrated current control word is indicative of the adjusted magnitude of the current to be calibrated.

8. The method according to claim 1, wherein:
   adjusting the magnitude of the temporary current is performed using a positive quantization error; and
   adjusting the magnitude of the current to be calibrated is performed using a negative quantization error.

9. The method according to claim 1, wherein:
   adjusting the magnitude of the temporary current is performed using a negative quantization error; and
   adjusting the magnitude of the current to be calibrated is performed using a positive quantization error.

10. A current calibration circuit having an inherent offset, comprising:
    first and second current sources adapted to provide first and second currents having adjustable magnitudes;
    a switch circuit coupled to receive a reference current and the second current and adapted to provide the reference current during a first phase and the second current during a second phase;
    a comparator circuit coupled to the switch circuit and coupled to receive the first current, the comparator circuit adapted to provide a comparison signal; and
    a calibration circuit coupled to receive the comparison signal, the calibration circuit adapted to adjust the first current magnitude to be substantially equal to the reference current during the first phase and adapted to adjust the second current magnitude to be substantially equal to the adjusted magnitude of the first current during the second phase, such that the adjusted magnitude of the second current is substantially void of the inherent offset;
    wherein the first and second current sources comprise:
       a coarse current source adapted to provide a coarse current having a predetermined magnitude at a current node; and
       a fine current source coupled to the current node and adapted to provide a fine current having a variable magnitude and a variable polarity at the current node.

11. The current calibration circuit according to claim 10, wherein the fine current source comprises:
    a polarity switch coupled to receive a polarity signal and adapted to control the polarity of the fine current in response to the polarity signal; and
    a plurality of current switches coupled to the polarity switch and adapted to control the magnitude of the fine current, wherein each of the plurality of current switches is coupled to receive a control bit and is adapted to conduct a current in response to an asserted control bit.

12. The current calibration circuit according to claim 11, wherein the polarity switch comprises a current mirror adapted to conduct the fine current in a first direction relative to the current node in response to a first logic value of the polarity signal.

13. The current calibration circuit according to claim 12, wherein the polarity switch is adapted to conduct the fine current in a second direction relative to the current node in response to a second logic value of the polarity signal, the second direction different from the first direction.

14. A method for tuning an operational current to a reference current, the method comprising:
    in a first phase of operation,
       performing a first comparison of a reference current with a temporary current;
       monitoring a polarity of the first comparison while incrementally adjusting a magnitude of the temporary current; and
       recording the adjusted temporary current magnitude and a comparison error signal in response to detecting a change in the result of the first comparison; and
    in a second phase of operation,
       performing a second comparison of an operational current with a sum of the adjusted temporary current magnitude and the comparison error signal;
       monitoring a polarity of the second comparison while incrementally adjusting a magnitude of the operational current; and
       recording a magnitude of the adjusted operational current in response to detecting a change in the result of the second comparison.

15. The method according to claim 14, wherein the first phase of operation is performed using a positive quantization error and the second phase of operation is performed using a negative quantization error.

16. The method according to claim 15, wherein monitoring the polarity of the first comparison comprises comparing a magnitude of the temporary current relative to a magnitude of the reference current.

17. The method according to claim 16, wherein detecting a change in the result of the first comparison comprises determining that the magnitude of the temporary current exceeds the magnitude of the reference current.

18. The method according to claim 17, wherein recording the adjusted temporary current magnitude comprises decreasing an adjusted temporary current control word by one decrement if the adjusted temporary current magnitude is subtractive.

19. The method according to claim 15, wherein monitoring the polarity of the second comparison comprises comparing a magnitude of the operational current relative to a magnitude of the adjusted temporary current.

20. The method according to claim 15, wherein detecting a change in the result of the second comparison comprises determining that the magnitude of the operational current exceeds the magnitude of the adjusted temporary current.

21. The method according to claim 15, wherein recording the magnitude of the adjusted operational current magnitude comprises decreasing an adjusted operational current control word by one decrement if the adjusted operational current magnitude is additive.

22. The method according to claim 14, wherein the first phase of operation is performed using a negative quantization error and the second phase of operation is performed using a positive quantization error.

23. The method according to claim 22, wherein monitoring the polarity of the first comparison comprises comparing a magnitude of the temporary current relative to a magnitude of the reference current.

24. The method according to claim 22, wherein detecting a change in the result of the first comparison comprises determining that the magnitude of the temporary current exceeds the magnitude of the reference current.

25. The method according to claim 22, wherein recording the adjusted temporary current magnitude comprises decreasing an adjusted temporary current control word by one decrement if the adjusted temporary current magnitude is additive.

26. The method according to claim 22, wherein monitoring the result of the second comparison comprises comparing a magnitude of the operational current relative to a magnitude of the adjusted temporary current.

27. The method according to claim 22, wherein detecting a change in the result of the second comparison comprises determining that the magnitude of the operational current exceeds the magnitude of the adjusted temporary current.

28. The method according to claim 22, wherein recording the adjusted operational current magnitude comprises decreasing an adjusted operational current control word by one decrement if the adjusted operational current magnitude is subtractive.

29. In a current-steering segmented Digital to Analog Converter (DAC), a method of calibrating each thermometer current source to a reference current source, the method comprising:
comparing the reference current source with a temporary current source, identifying a comparison error signal from the comparison;
adjusting a magnitude of the temporary current source to be substantially equal to a sum of the comparison error signal and the reference current source;
comparing each thermometer current source with the adjusted temporary current source;
adjusting a magnitude of each thermometer current source to be substantially equal to the difference between the adjusted temporary current source and the comparison error signal; and
generating the reference current source as a sum of all binary current sources plus one Least Significant Bit (LSB) current source.

30. The method according to claim 29, wherein:
comparing the reference current source with the temporary current source comprises using a negative quantization error while adjusting the magnitude of the temporary current source; and
comparing each thermometer current source with the adjusted temporary current source comprises using a positive quantization error while adjusting the magnitude of each thermometer current source.

31. The method according to claim 29, wherein:
comparing the reference current source with the temporary current source comprises using a positive quantization error while adjusting the magnitude of the temporary current source; and
comparing each thermometer current source with the adjusted temporary current source comprises using a negative quantization error while adjusting the magnitude of each thermometer current source.

32. The method according to claim 29, further comprising providing a backup current source while adjusting the magnitude of each thermometer current source.

33. A programmable current source, comprising:
a first current source coupled to receive a first bias signal and adapted to generate a first current at a current node in response to the first bias signal; and
a second current source coupled to the current node and coupled to receive a digital control word, wherein the second current source is adapted to bi-directionally combine the second current with the first current at the current node in response to the digital control word;
wherein the digital control word includes a polarity bit and a plurality of magnitude bits.

34. The programmable current source according to claim 33, wherein the second current source comprises:
a polarity switch coupled to receive the polarity bit and adapted to control the direction of the second current at the current node in response to the polarity bit; and
a plurality of current switches coupled to the polarity switch, wherein each one of the plurality of current switches is coupled to receive one of the plurality of magnitude bits and is adapted to conduct a current in response to the magnitude bit.

35. The programmable current source according to claim 34, wherein each one of the plurality of current switches includes a transistor having a control terminal coupled to receive the magnitude bit and a conduction terminal coupled to the polarity switch.

36. The programmable current source according to claim 34, wherein the polarity switch comprises a current mirror adapted to conduct the second current in a first direction relative to the current node in response to a first logic value of the polarity bit.

37. The programmable current source according to claim 36, wherein the polarity switch is adapted to conduct the second current in a second direction relative to the current node in response to a second logic value of the polarity bit, the second direction different from the first direction.

38. The programmable current source according to claim 33, further comprising a cascode transistor coupled to the second and first current sources and coupled to the current node to increase an output impedance of the programmable current source.

* * * * *